United States Patent [19]

Hillis et al.

[11] 3,833,436

[45] Sept. 3, 1974

[54] ETCHING OF POLYIMIDE FILMS

[75] Inventors: Benjamin F. Hillis, Lindstrom, Minn.; Russell D. Klint, Roberts, Wis.; William D. Cross, St. Paul, Minn.

[73] Assignee: Buckbee-Mears Company, St. Paul, Minn.

[22] Filed: Sept. 5, 1972

[21] Appl. No.: 286,344

[52] U.S. Cl. .................... 156/13, 96/36, 252/79.1

[51] Int. Cl. .................... B44c 1/22

[58] Field of Search .............. 156/2, 3, 8, 13; 96/36; 252/79.1

[56] References Cited

UNITED STATES PATENTS

| | | | |
|---|---|---|---|
| 3,395,057 | 7/1968 | Fick | 156/2 X |
| 3,554,880 | 1/1971 | Jenkin | 156/2 X |
| 3,594,170 | 7/1971 | Broyde | 156/3 X |

*Primary Examiner*—William A. Powell
*Attorney, Agent, or Firm*—Jacobson and Johnson

[57] ABSTRACT

A process for the etching of polyimide films which includes applying a photo sensitive resist of a predetermined viscosity and utilizing hydrazine as an etchant to remove unwanted sections of the polyimide film after exposing and developing the light sensitive resist.

1 Claim, No Drawings

ETCHING OF POLYIMIDE FILMS

BACKGROUND OF THE INVENTION

1. Field of the Invention

This invention relates generally to etching and more specifically, to the etching of polyimide films.

2. Description of the Prior Art

One of the advantages of using polyimides and particularly polyimide film is the outstanding physical characteristics of the film makes it useful in high temperature applications and electrical circuit applications. Not only are the high temperature properties useful but the wear resistance, high strength, dimensional stability, toughness, dielectric strength and radiation resistance make the polyimide material useful for applications which undergo severe stress.

A typical commercial example of such polyimide films is manufactured and sold under the trademark "Kapton." Although these films do have superior physical properties, they are difficult to etch using conventional techniques because it is difficult to apply a photosensitive resist to the polyimide film as well as to provide a suitable etchant to selectively remove portions of the polyimide film. There are commercially available photosensitive resists which can be utilized with polyimide films. One such resist is known and sold under the name of "Kodak Thin Film Resist" (KTFR), which is a Kodak trademark. This resist is based on the cross-linking of polymerized isoprene dimers. The KTFR resist is believed to have the following structural formula:

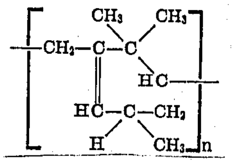

This photoresist reacts to form a series of short polymerized chains.

SUMMARY OF THE INVENTION

Briefly, the present invention comprises a two-step process of applying a photosensitive resist solution of predetermined viscosity followed by hardening and drying the resist. After the photosensitive resist has been exposed, developed and cured, the polyimide film and resist are immersed in the hydrazine etching solution. The hydrazine etching solution removes the portions of the polyimide film not protected by the resist. In order to provide more precision etching, an ultrasonic generator is placed in the etching solution to continually agitate the etchant solution during the etching process.

DESCRIPTION OF THE PREFERRED PROCESS

In the preferred process of the present invention, one basically applies a resist to the polyimide film and subsequently etches away the unprotected portion of the polyimide film. However, in order to prepare the polyimide film for etching, one should begin by cleaning the surface of the polyimide film by washing it in a washing solution such as acetone or methyl ethyl ketone solvent. This is for the purpose of cleaning the surface of the polyimide film to insure that the film does not have any foreign particles on it which would make it difficult for the resist to adhere to. Obviously, this step is not necessary if the material is kept free from contaminants prior to applying the photosensitive resist to the polyimide material.

In the next step of the process, one may wash the surface of the polyimide film with a solvent that has a wetting action. Any number of commercially available solvents can be utilized. Typical examples are a dimethylethyl formamide and dimethylethyl acetamide. After washing with a wetting agent, one can remove any remaining dust on the surface by static cleaning. Thus, the first phase of the process merely involves cleaning the surface of the polyimide film to receive the photosensitive resist. After cleaning, the polyimide film is ready to receive the resist. A suitable photoresist is Kodak Thin Film Resist (KTFR) which comprises polymerized isoprene dimers. This resist has been found especially suitable with polyimide films because of its flexibility. However, we have discovered that it must be thinned to the proper viscosity in order to properly form a film that adheres to the film. That is, it has been found that the photoresist must be diluted to a certain viscosity range in order to obtain a tough, flexible film which will withstand the rigors of the etching solution and handling. Typically, one can control the viscosity by thinning the resist with a solvent such as 12 percent ethyl benzene, 82 percent mixed xylenes and 6 percent methylcellosolve or xylenes until one obtains a viscosity ranging from about 100–400 centiposes at 25° C. Then the entire polyimide film is immersed or dipped into the photosensitive solvent solution bath. Next, one removes the film from the immersion bath and passes it quickly through an infra red oven which is at a temperature ranging from about 180° F. to about 250° F. At this temperature, the solvents quickly evaporate leaving a thin layer of photosensitive resist on the polyimide film. However, the photosensitive resist is not allowed to reach thermal equilibrium with the oven temperature as it passes quickly through the oven. This high temperature effectively evaporates the volatiles without baking or harming the photosensitive resist.

After placing a first layer or coating of photosensitive resist on the film, the film is again dipped into the photosensitive resist solution bath to place a second layer of resist over the first layer. It has been found that the second layer materially adds to the resolution and the strength of the resist coat. Thus, the purpose of the second layer is to obtain a stronger resist surface because it has been found that a single application of resist sometimes does not produce a well defined coating and does not adequately protect the film during etching.

After removing the film from the photosensitive resist solution, the film and resist again are heated in an infra red oven in which the temperature ranges from 180° to 250° F. in order to quickly drive off all the volatiles.

After applying the second resist coating, the resist is exposed and developed according to conventional techniques. In the KTFR resist, the sensitizer is believed to be 2.6 bis (P-azidobenzilidene)-4-methylcyclohexanone. However, any of the common utilized sensitizers could be used. After the developing, the resist is placed through a post bake cycle at approximately 200° F. for approximately 30 minutes. At this point, the polyimide film with its partially protected resist coat is ready for immersion into the etchant bath.

In order to etch the polyimide film with the protective resist, one immerses the entire polyimide film into a bath filled with hydrazine. It has been found that in order to improve distribution of the hydrazine throughout the etching bath, one can place an ultrasonic generator in the bath. If one intends to etch only one side of the polyimide film, we have found that the best results are obtained if one cycles the ultrasonic generator for approximately five-second intervals. This is continued until the etching is completed. After the polyimide film has been etched in the hydrazine bath, it is removed and a suitable stripping agent is applied to remove the resist from the film.

It has been found that this process of etching polyimide film produces sharp, well defined lines and regular surfaces. In addition, the photo sensitive resist with an isoprene base does not break off and instead, adheres tenaciously to the film during the etching thus reducing and minimizing failures due to etching in areas where the resist has failed.

We claim:

1. The process of selectively removing a portion of a polyimide substrate comprising the steps of:

cleaning the surface of the polyimide substrate to remove any foreign particles thereon;

applying a wetting agent to the cleaned surface of the polyimide substrate;

coating the polyimide substrate with a first thin film of photoresist solution comprising an isoprene dimer and a solvent solution, said photoresist solution characterized by having a viscosity ranging from about 100 centiposes to about 400 centiposes at 25° C. followed by exposing the first thin layer of photoresist solution to a heat source in excess of 180° F. to thereby harden the photoresist coating without allowing the photoresist film to reach thermal equilibrium with the heat source;

coating the polyimide substrate with a second thin film of photoresist solution comprising an isoprene dimer and a solvent solution, said photoresist solution characterized by having a viscosity ranging from about 100 centiposes to about 400 centiposes at 25° C.;

exposing the second thin layer of photoresist solution to a heat source in excess of 180° F. to harden said second thin film of photoresist without allowing the film to reach thermal equilibrium with the heat source;

exposing and developing the photoresist to remove preselected sections;

immersing the polyimide substrate with the first and second photoresist film in a hydrazine bath so that said hydrazine etches away unprotected regions of the polyimide substrate including ultrasonically agitating the hydrazine bath during the etching of unprotected regions of the polyimide substrate.

* * * * *